United States Patent [19]

Merry et al.

[11] Patent Number: 4,907,863
[45] Date of Patent: Mar. 13, 1990

[54] DIGITAL FREQUENCY SYNTHESIZER FOR USE WITH PRECISION AO SCANNING AND POSITIONING

[75] Inventors: J. Bradford Merry, Annapolis; Thomas Hubin, Laurel, both of Md.

[73] Assignee: Chesapeake Laser Systems, Inc., Lanham, Md.

[21] Appl. No.: 247,831

[22] Filed: Sep. 22, 1988

[51] Int. Cl.$^4$ ............................................... G02F 1/33
[52] U.S. Cl. .................................................. 350/358
[58] Field of Search ................. 350/358, 353, 6.1, 6.2, 350/6.3

[56] References Cited

U.S. PATENT DOCUMENTS 4,499,437  2/1985  Blazey ............................. 350/358 X
4,505,550  3/1985  Steinbruegge .................. 350/358 X
4,536,062  8/1985  Price et al. ....................... 350/358

Primary Examiner—Eugene R. LaRoche
Assistant Examiner—Nathan W. McCutcheon
Attorney, Agent, or Firm—Roylance, Abrams, Berdo & Goodman

[57] ABSTRACT

The invention comprises a digital frequency generator particularly adapted for use with acousto-optical scanning devices, and particularly for such devices as for producing a scan or a raster scan or the like. The invention electronic circuitry includes a precision timing generator which is made up of a tapped delay line which feeds a multiplexor to produce an output pulse of any desired configuration. The output pulses are produced in a stream, but each pulse is produced individually.

9 Claims, 4 Drawing Sheets

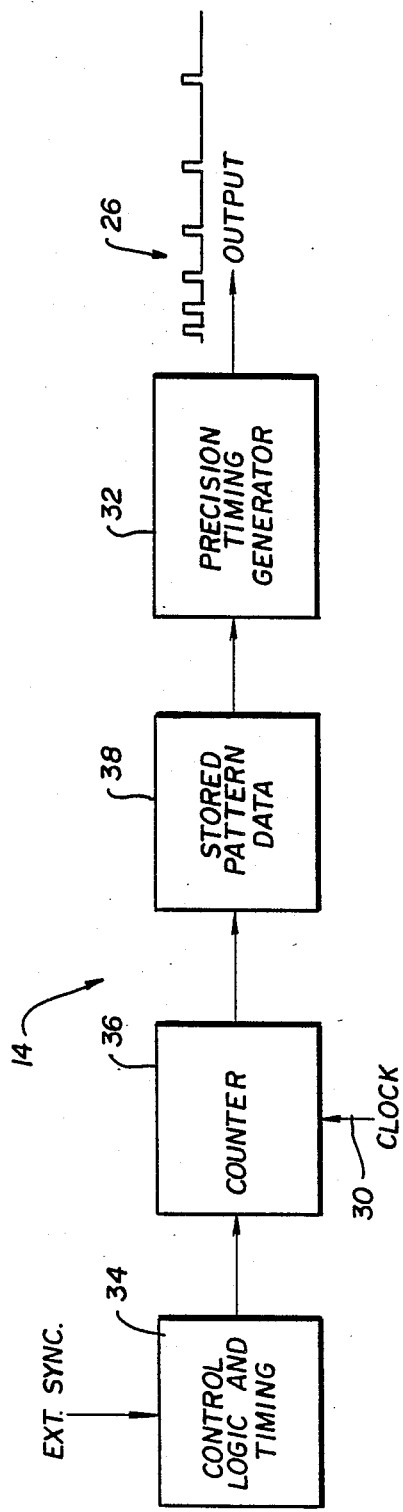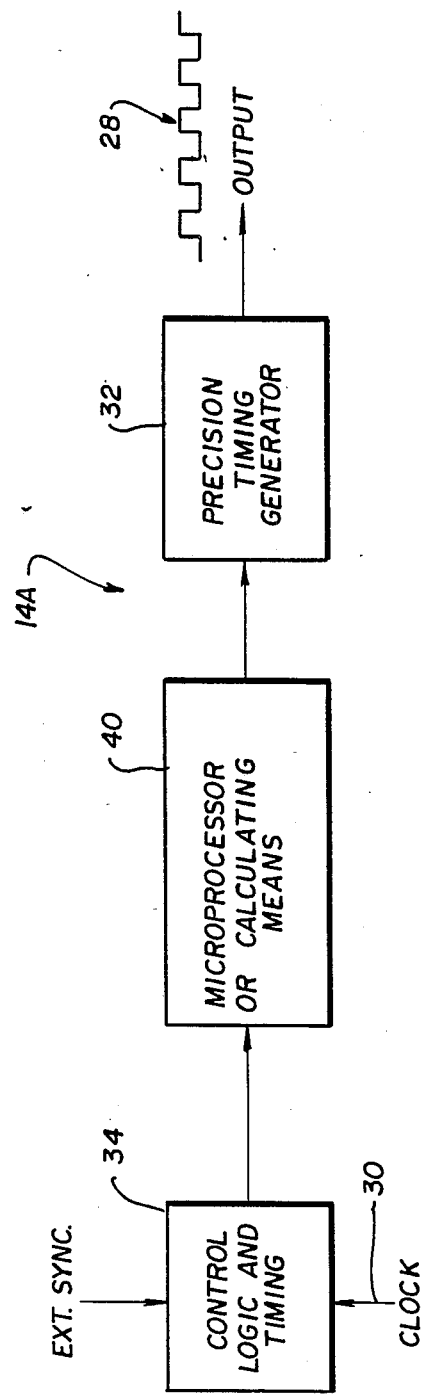
FIG.4 ("CHIRP" OR OTHER PATTERN FREQUENCY)
FIG.5 (CONSTANT FREQUENCY)

DIGITAL FREQUENCY SYNTHESIZER FOR USE WITH PRECISION AO SCANNING AND POSITIONING

FIELD OF THE INVENTION

This invention relates to an electronic circuit for digitally producing a predetermined frequency pulse stream, either at a constant rate or at a changing rate or in accordance with a predetermined pattern. The frequencies generated are particularly adapted for use with acousto-optic (AO) scanning and positioning systems. Such AO systems find applications in high precision CRT's, television, and the like. Many other high technology industrial and scientific applications utilize such signals.

BACKGROUND OF THE INVENTION

AO cells find usages in laser scanning systems of high precision, "high precision" being understood to mean an accuracy of position of at least 1 part in ten thousand. Further, such systems involve a settling time when changing frequency of less than one microsecond. High speed access at a high degree of repeatability is also required. It has been found that digitally generated signals are preferred over analog methods in general.

Voltage control oscillators (VCOs) often change frequency with temperature. This is highly undesirable in many applications. Phase locked loops (PLLs) are more stable than VCOs, but cannot often achieve the required quick settling time.

The prior art includes systems of generating such frequencies using a sampled sinusoid. Means to perform such methods suffer from a high degree of complexity and a corresponding high cost. They require an accumulator, a sine look-up table and a digital to analog converter. Often each of these components must be clocked at rates in excess of double the highest frequency to be generated. That is a severe disadvantage which is overcome by the invention. This disadvantage, and the corresponding advantage of the invention, is further multiplied in that the components are often clocked at three to ten times the highest frequency to be generated. For example, if a 100 MHz sinusoid is desired, the clock to drive the system will often function at a minimum of 200 MHz and will more likely be operated at a frequency in excess of 300 MHz.

Thus, while the sampled sinusoid method and apparatus can achieve acceptable accuracy, spectral purity, and fast settling, it has a severe disadvantage of being complicated and relatively expensive.

SUMMARY AND ADVANTAGES OF THE INVENTION

The invention has the advantages of being manufacturable from relatively simple components as to the electronic circuitry, and from entirely state of the art components as to all of the circuitry, the laser and the AO cell utilized. This produces enormous advantages in the economic area as compared to prior art systems.

As to performance, the output frequency is quite acceptable for AO applications, and is highly versatile and has other advantages. For example, the invention system can be used to produce a constant output utilizing a calculating means, or can be used to produce any one of a variety of predetermined patterns of frequency outputs utilizing a table of stored data. In both cases, a relatively simple and conventional precision timing generator which includes essentially a tapped delay line is utilized. The present invention takes a digital approach dependent upon the tapped delay line wherein the output can be caused to occur at even higher frequencies than the frequency of the clock driving the system.

The invention operates by individually producing each pulse in the output stream to thereby control the constant or changing period of that output stream.

In one preferred embodiment, when producing a scan, a particular pattern of changing frequency known as a "chirp" is used. A chirp is a frequency which changes with time. When such a chirp signal is input to an AO cell which is also subjected to a laser light input, the output is inhertly a scan line of the laser light. Thus, when used for scanning, the ability to produce such a high speed, reproducible, highly accurate input chirp signal for use in an AO cell is an important advantage of the invention, and is one of its primary areas of applications.

The above and other features and advantages of the invention will be clear to those skilled in the art with reference to the following detailed description and the accompanying drawing also forming a part of this disclosure, wherein:

BRIEF DESCRIPTION OF THE DRAWING

FIGS. 4 and 5 are a pair of companion logic diagrams illustrating the manner of operation of two forms of the invention frequency generator;

DETAILED DESCRIPTION OF THE PREFERRED EMBODIMENTS

Figure 1:
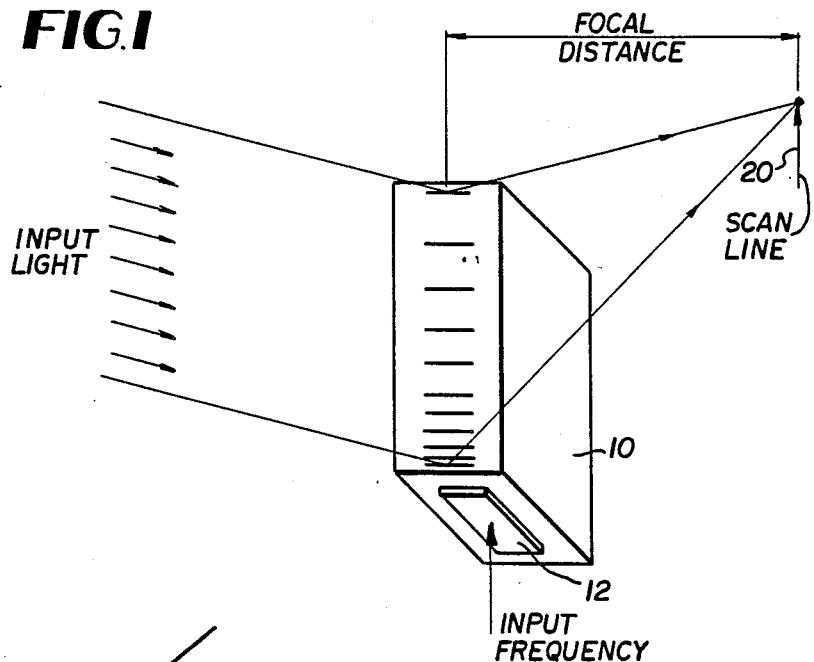
FIG. 1 is a schematic diagram illustrating the manner of operation of AO cells.
Figure 3:
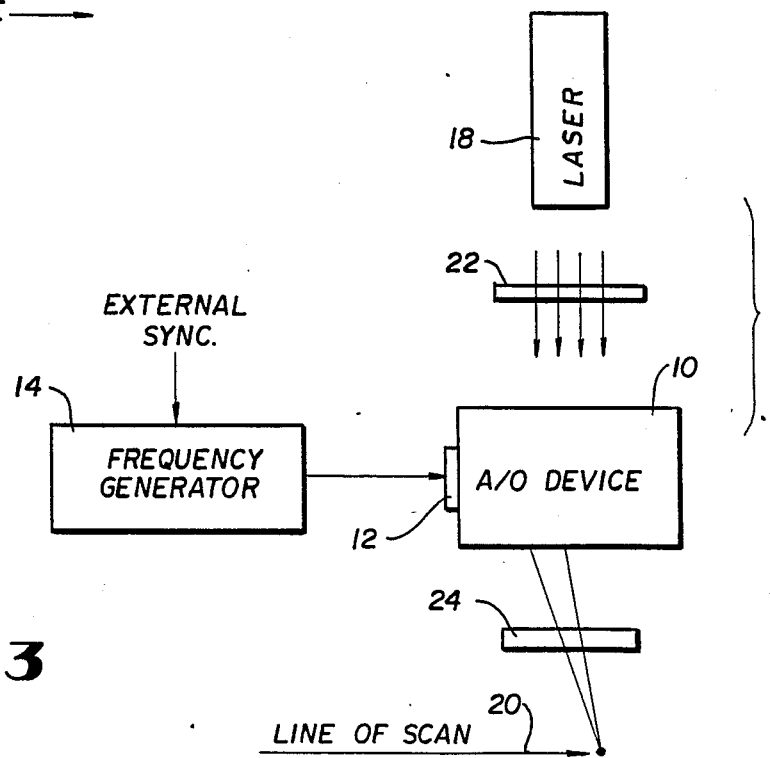
FIG. 3 is a schematic diagram of an overall AO scanning system utilizing the invention frequency generator.

Referring now to FIG. 1, there is shown an AO device 10 to which is affixed a transducer 12. An input frequency indicated by the arrow is supplies to the transducer 12. The device 10 is made of glass or a glass like material. Input light energy, most frequently in the form of laser light, is also provided to the device 10. FIG. 3 shows a typical arrangement in somewhat more detail. The frequency can be input into either end of the AO device 10.

The array of horizontal lines on the front face of the AO device 10 indicates the input of a "chirp" or time dependent frequency change input frequency at the transducer 12. This will change the light input on the left hand side of the AO device 10 from a straight parallel sheet into a traveling point or a scan line, as indicated by the arrows in FIG. 1 on the right hand side. This is known in the art as a cylindrical traveling lens. The phenomenon is described in greater detail in U.S. Pat. No. 3,851,951 to Eveleth issued on Dec. 3, 1974.

One important goal of the invention is to produce a highly linear, highly reproducible, and very fast chirp input frequency. This input frequency will produce a very fast, very accurate raster scan in the arrangement shown in FIG. 3, coupled with other well known features of the AO art, not shown.

Figure 2:
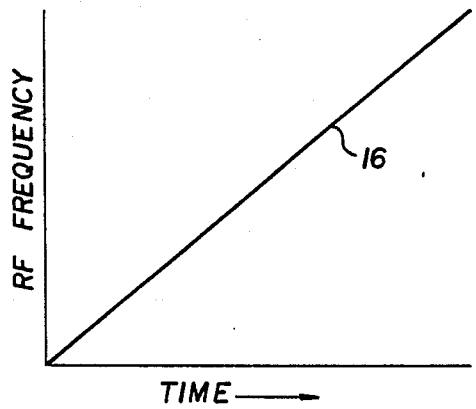
FIG. 2 is a drawing illustrating the linear response of frequency with respect to time desired in AO cells such as that of FIG. 1.

FIG. 2 shows the type of chirp frequency to be input to the device 10 by the transducer 12 and to be produced by the invention frequency generator 14 shown in FIG. 3. The horizontal lines separated by spices which increase moving upwardly are meant to represent a "chirp", that is, a ramp function change of frequency with respect to time. This is illustrated by the curve 16 of FIG. 2. It is to be noted that the curve or line 16 is straight, and indicates the reproducibility of the output frequency, and thus the scan lines produced by the invention.

As to the performance improvements of the invention, linearity in the prior art at its best is on the order of one part in five hundred. The prior art, with great difficulty and relatively high cost of components, has also been able to achieve a linearity on the order of one part in three thousand. The present invention, using considerably simpler electronics and in accordance with the concepts of the invention, produces a linearity on the order of one part in one million parts. Thus, it can be seen that the present invention is on the order of a thousand to two thousand times better as to linearity than the state of the art.

"Linearity" as used herein, and as is understood by those skilled in the art, refers to the angle of laser deflection which is proportional to the signal frequency. In order to produce a lens effect, light must exit the cell converging to a single point. The angle of deflection must then vary along the length of the cell. The spatial frequency of the acoustic wave at any location if the cell must be equal to $ax+b$ where x is the location of a single wave in the AO cell and a and b are constants.

The linear accuracy in use of the invention is better then one part in ten thousand.

Another definition can also be thought of in terms of a diffraction grating with a monotonically varying spacing such that collimated light entering the grating is diffracted so as to cause the exiting light to converge to a point.

However, it is not strictly necessary that entering light be collimated. It may be converging or diverging; as long as the diffraction grating behaves as a lens, one can correctly use the term "linear chirp" for the output.

Referring now to FIG. 3, the application of the invention frequency generator 14 to an AO cell or system includes a laser 18 of any conventional type as is known to those skilled in the AO arts. The line of scan 20 shown at the bottom of the drawing is the same line 20 as if shown in FIG. 1. That is, both FIGS. 1 and 3 illustrate the same principle of generating a scan line 20 which may be used with other means not shown to produce a raster pattern.

As will be described in more detail below, the invention frequency generator operates using a square wave. A square wave is uniquely suited to use with AO scanners because such laser scanning systems have "windows" built into them wherein they can select the particular angle or range of angles that are of particular interest. A square wave supplied to the AO device 10 will tend to produce a wide spectrum of output light beams. Under normal circumstance this could be a problem. However, it is not a problem in the invention nor in the field of AO devices in general, because of the selection means which both preceed and follow the path of light with respect to the AO device 10. This is indicated by the input optics 22 and the output optics 24 which accomplish these goals. That is, the means 22 and 24 confine the laser energy from the laser 18 to that part of the spectrum which is of interest for the particular task being performed. Therefore, any undesirable spectral portions produced by the invention are, in effect, filtered out and rendered harmless.

Referring now to FIGS. 4 and 5, there are shown two variations of the frequency generator block 14 of FIG. 3. These are the "chirp" or other patterned output frequency arrangement of FIG. 4, and the constant output frequency generator 14A of FIG. 5. The output 26 of FIG. 4 indicates a "chirp", and the output 28 of FIG. 5 indicates a constant frequency. Both are square wave outputs.

The invention will be best understood by way of a specific example. Let it be assumed that it is desired to have a frequency of 100 MHz. This will produce an output square wave having a period of 10 nanoseconds. With a square wave having a 10 nanosecond period, transitions will occur twice each period. Thus, a transition (high to low or low to high) must occur one every 5 nanoseconds. Further, let it be assumed that an accuracy of 1 nanosecond is required. "Accuracy" is defined as placing the transition to within 1 nanosecond of the ideal predicted place where that transition should occur. Further, let it be assumed that the clock input indicated at 30 in FIGS. 4 and 5 is operating at a frequency of 125 MHz, which corresponds to a clock period of 8 nanoseconds.

Thus, an important advantage of the invention can now be appreciated. Namely, the input of the clock is on an 8 nanosecond accuracy, but the output 26 or 28 is at an accuracy of 1 nanosecond. This is a result of this particular example, other ratios could be achieved. The important point is that an accuracy of the output signal is produced according to the invention greater than the accuracy of the clock driving the system. This is done in the precision timing generator 32 shown in FIGS. 4 and 5, and is explained more in detail in regard to FIG. 6.

Referring to FIGS. 4 and 5, the first block 34 marked "Control Logic and Timing" is indicative of the necessary conventional components required to produce an operating electronic circuit. These control logic and timing functions are easily within the skill of expert practitioners in these arts.

Referring to the patterned type of frequency generator 14 of FIG. 4, a counter 36 is used. The pulses from the counter 36 feed into a block 38 wherein a predetermined patterned of output data is stored. Thus, block 38 will also include memory means sufficiently large to keep the entire pattern desired of the output signal 26 of FIG. 4 stored therein.

Referring now in detail to FIG. 4, block 38 has a large number of addresses in it. Since a signal from block 36 comes in at the clock frequency of once each 8 nanoseconds, each address corresponds to an 8 nanosecond period of time. The output 26 from FIG. 4 is to occur once every five nanoseconds, corresponding to each transition. Referring to Table I, the column called "clock" corresponds to memory locations. So long as the output is divisible by 8 then that defines a memory address. The remainder gives a number of nanoseconds delay as shown in the following Table I which illustrates a constant 100 MHz output.

TABLE I

| STEPS | HALF PERIOD | OUTPUT | CLOCK | DELAY |
|---|---|---|---|---|
| 1 | — | 0 ns | 0 | 0 |
| 2 | 5 ns | 5 ns | 0 | 5 ns |
| 3 | 5 ns | 10 ns | 1 | 2 ns |
| 4 | 5 ns | 15 ns | 1 | 7 ns |
| 5 | 5 ns | 20 ns | 2 | 4 ns |
| 6 | 5 ns | 25 ns | 3 | 1 ns |
| . | . | . | . | . |
| . | . | . | . | . |
| . | . | . | . | . |
| max. | 1,637 (N) | 8,180 | 1,023 | — |

Table 1 can repeat depending upon the particular relationship of the size of the memory address and the desired period of the output signal 26. Where such a repetition occurs then the circuit can be arranged in a free running mode. Where there is a free running mode, then a reset line and the external sync line may not be needed. The external sync and a reset line are needed where a non-repeating pattern is encountered or where on/off or some other such manner of operation is desired.

Referring again to Table I, if a memory 38 were used having a typical number of addresses equal to 1,023, then the nearest number of 5 nanosecond intervals would be equal to 8,180, and this divided by five would make the steps equal to 1,637. However, Table I also includes an arbitrary number "N" as the number of steps to illustrate the flexibility of the invention as to its application with any number of steps of an output frequency pattern.

FIG. 5 shows a variation of FIG. 4 wherein the output 28 has a constant period. The output 26 can have a constant or a varying period. Of course, the preferred embodiment is where the period varies in order to produce the chirp or the varying frequency output signal required for use with the invention as shown in FIG. 3, that is, in conjunction with an AO device to produce fast reliable scans.

The calculating means 40 must have a speed of operation fast enough that it can produce the outputs 28 at the period desired. In the example shown, it must be able to produce a transition faster than once every 5 nanoseconds. This is well within the state of the art.

Another way to understand the difference between FIGS. 4 and 5 is that each block 38 and 40 is sort of pulse forming means which feeds into the block 32 described below. One would use the FIG. 5 calculating means (block 40) when the memory required is great and thus one calculates each value. One would use the memory approach of FIG. 4 when the pattern is short in duration or where the calculations are complicated. In that case, the calculations can be done off-line and then stored. Thus, the variations 14 and 14A feeding into the block 32 are seen to be choices dependent upon the particular demands of the particular situation. Sometimes one will be used and sometimes the other. Even composites thereof could be used, i.e., one could have a lot of the program stored and some of it calculated or alternatively a lot of it calculated and some of it stored. The important criteria is that blocks 38 or 40 serve as a supply of information which is used to form the outputs, as set forth herein.

Both FIGS. 4 and 5 feed into the same block 32 which is the precision timing generator of the invention. The block 32 is shown in more detail in FIG. 6, and FIG. 6 also illustrates the matter in which several blocks 32 can be "ganged" to accommodate all sorts of combinations of numbers required by any particular application.

The invention can also be understood by thinking of it as controlling the start time and the ending time of each pulse fed into transducer 12 individually. In this manner any sort of pattern of pulses or a stream of pulses at a constant frequency can be produced.

Figure 6:
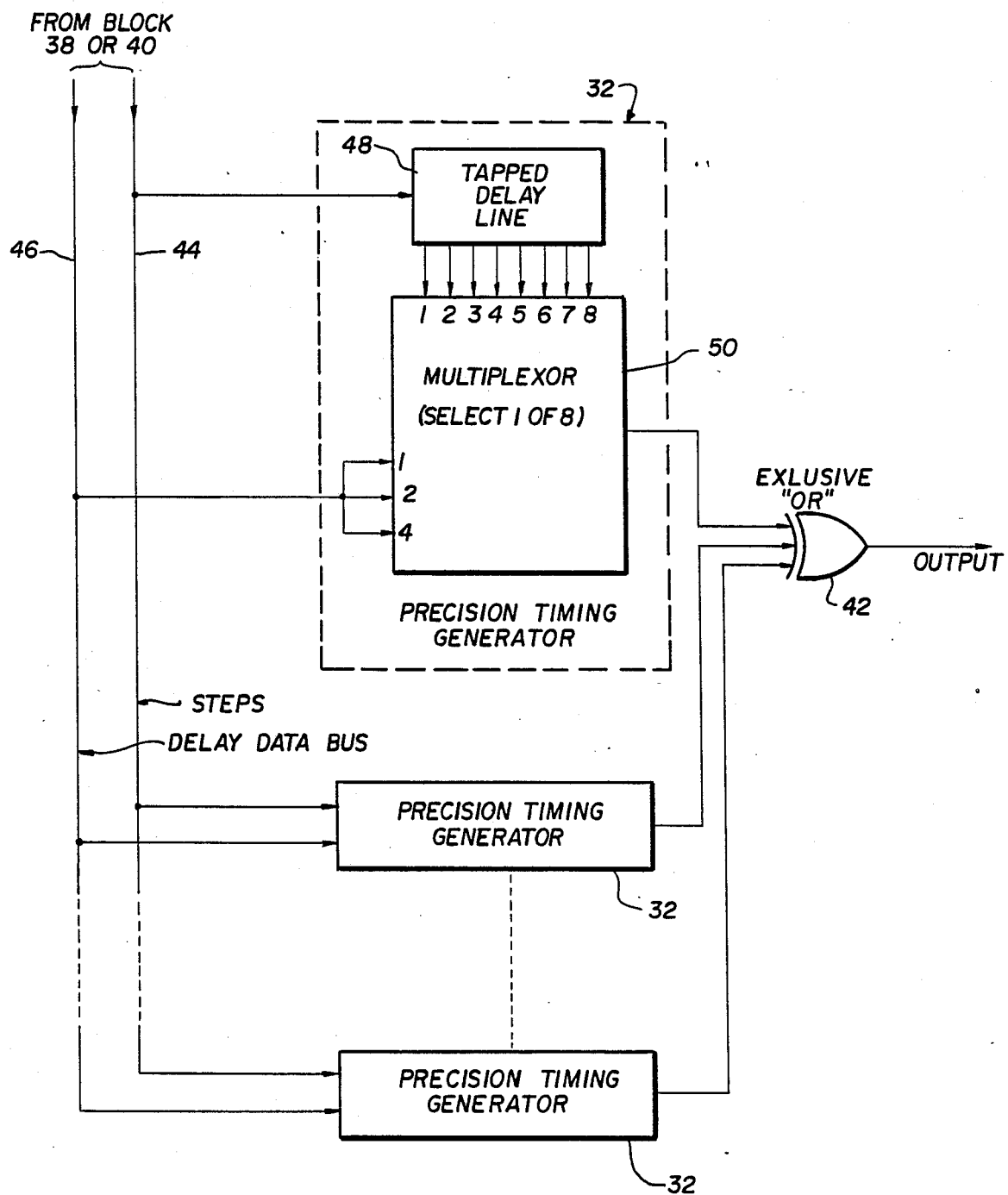
FIG. 6 is an electrical logic diagram of the precision timing generator utilized in the preferred forms of the invention.

For the particular example we are using here with an 8 nanosecond address and a 5 nanosecond desired output, two blocks 32 used in parallel are required because in the first memory location it so happens that two outputs are required, one at 10 nanoseconds and one at 15 nonoseconds with two different delays. In order to accomplish that, two circuits 32 arranged in parallel as shown in FIG. 6 are required feeding into exclusive or gate 42. If other relationships of the numbers 5 and 8 were to be used, that is, with a different desired output, a larger number of circuits 32 can be arranged in parallel with the one or more exclusive or gates 42. The gates 42 could be arranged in cascade, as needed. That kind of digital logic circuitry is well within the skill of experts in this art.

The nature of exclusive or gate 42 is that it will produce an output when there is input on either line feeding into it, but will not produce an output if there is an input on both lines feeding into it.

As shown in FIG. 6, the data from block 40 or 32 to block 32 is on four data output lines. They give the information located at each particular address in the memory or as calculated, in sequential order, four bit value is stored at each memory location. The memory is caused to move from one memory location to the next in order by a signal on a line 44, called "STEPS". The data is provided on a set of date lines, called "DELAY uATA BUS", line 46.

The working components, conceptually and primarily in block 32, are a tapped delay line 48, and a multiplexor 50. Three data inputs from line 46 feed into the multiplexor 50. The data on these three lines define the number of nanoseconds of delay as set forth in Table I for each step. The tapped delay line 48 produces an output on each of its eight output lines 0 through 7 sequentially. That is, the "0" line is activated immediately, tap line "1" after a one nanosecond delay, tap line "2" after a two nanosecond delay, etc. Then, dependent upon the number of nanoseconds of delay determined by the data in line 46, and a pulse after the particular corresponding number of nanoseconds of delay off of the blocks 48 and 50 are then fed to an output line feeding into the exclusive or gate 42.

This example used an 8 nanosecond long memory and a 5 nanosecond long period of output. The invention can operate with any such combination of numbers, and with numbers wherein the output is either longer or shorter than the period of the clock feeding into the counter 36 (FIG. 4), and then feeding into block 118 (FIGS. 4 and 5). Those skilled in the art will understand how to provide an appropriate truth table, and how to gang as many of the blocks 32 as are required for any particular combination of such operating parameters.

The two blocks 48 and 50 in block 32 are available commercially as a single piece of digital logic equipment called a programmable delay line. It is shown and described herein as two blocks 48 and 50 in order to facilitate understanding the underlying concepts of the invention.

Table II is a table similar to table 1 but showing similar times where the output is a "chirp", see output 26 in FIG. 4.

TABLE II

| STEPS | HALF PERIOD | OUTPUT | CLOCK | DELAY |
|---|---|---|---|---|
| 1 | — | 0 ns | 0 | 0 |
| 2 | 10 ns | 10 ns | 1 | 2 ns |
| 3 | 9 ns | 19 ns | 2 | 3 ns |
| 4 | 8 ns | 27 ns | 3 | 3 ns |
| 5 | 7 ns | 34 ns | 4 | 2 ns |
| 6 | 6 ns | 40 ns | 5 | 0 ns |
| 7 | 5 ns | 45 ns | 5 | 5 |

The above Table II is illustrative of a sweep or "chirp" from 50 MHz to 100 MHz over a 45 ns time span. This Table is slightly approximate because it was produced by taking the half period from 10 ns to 5 ns in full 1 ns steps. This is illustrative only because in actual use of the invention, the accuracy will be much better.

Figure 7:
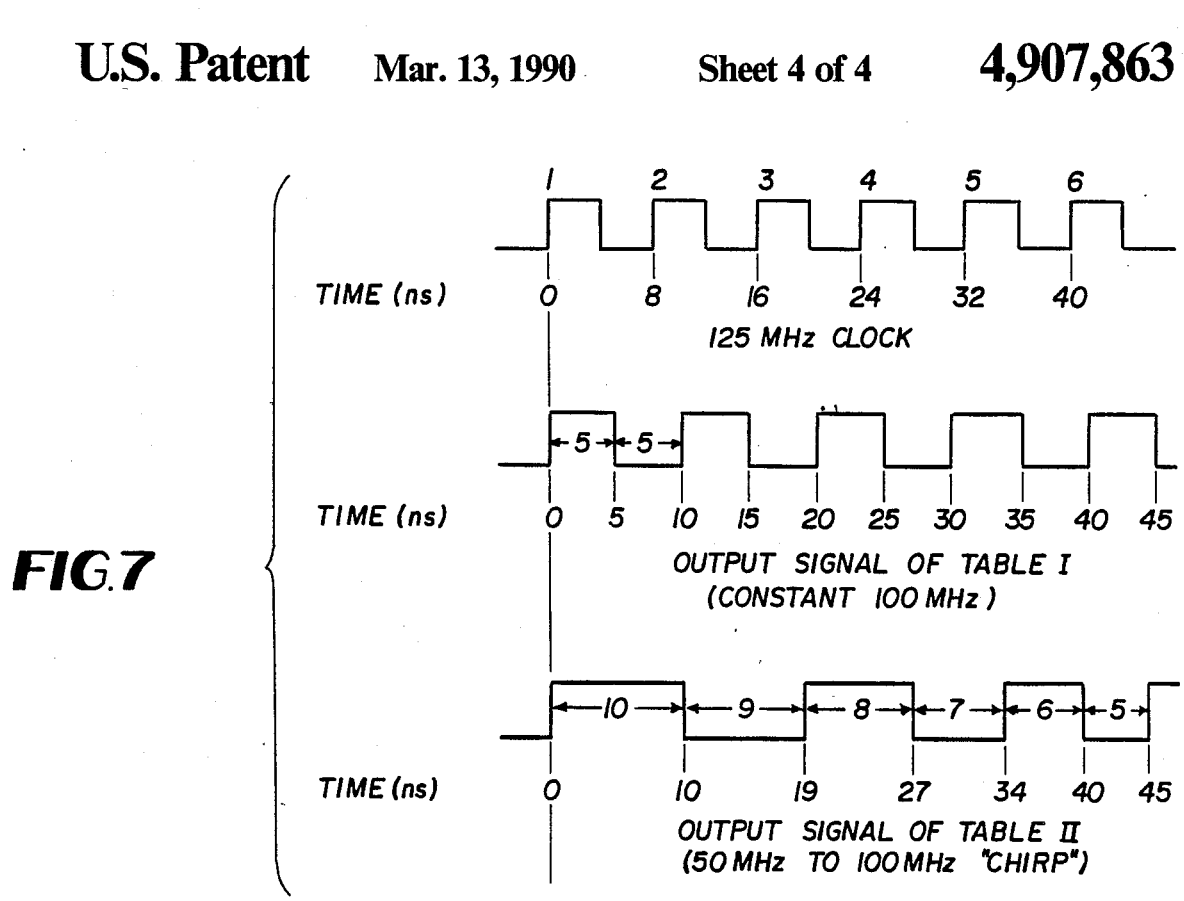
FIG. 7 is a timing diagram.

The attached FIG. 7 shows the relation of the examples of Table I and II to the clock frequency used in these examples.

Figure 8:
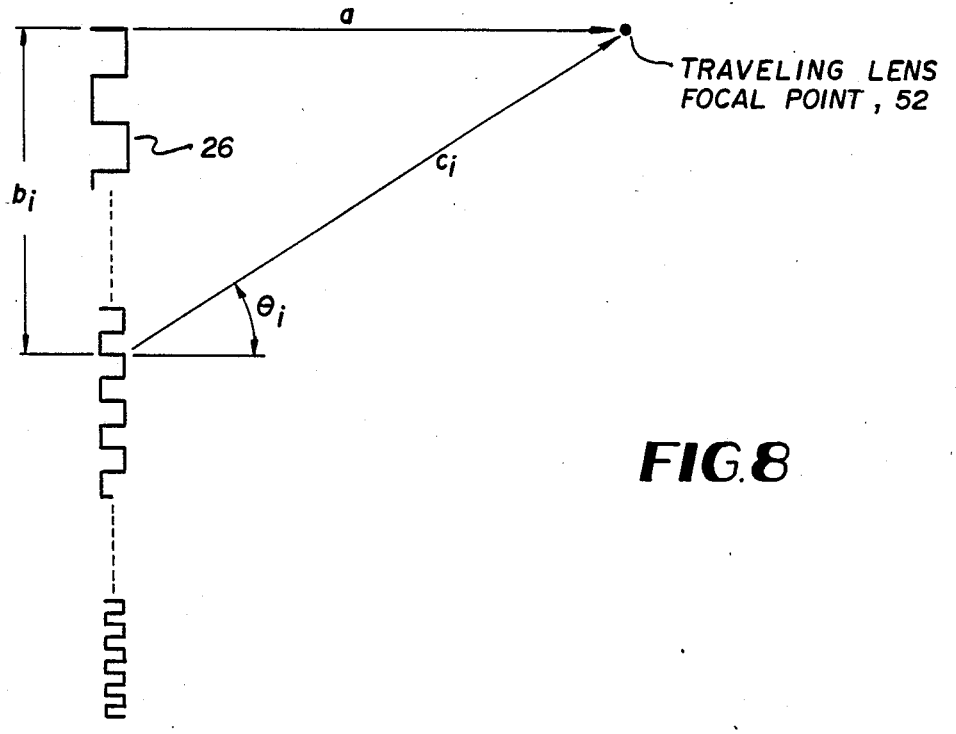
FIG. 8 is a diagram useful to help explain the mathematics underlying the invention.

FIG. 8 and the following description illustrate the underlying mathematical basis of the invention.

For a traveling lens effect to occur, the distance from each crest of the acoustic beam 26 to the focal point 52 must be an integer number of light wavelengths so that constructive interference takes place at the focal point. Each valley of the acoustic beam will be a half wavelength greater distant 3 than it's immediately preceeding crest.

The value a is the focal length of the traveling lens. The value c is the distance from an acoustic beam crest or valley to the focal point 52. The value b is the location of a crest or valley along the acoustic beam and is calculated as follows:

$$b_i = \sqrt{C_i^2 - a^2}$$

where $C_i = \frac{i\lambda}{2}$ and $i$ is an integer $\lambda$ is the light wavelength The distance value of $b_i$ are then coverted to transition time $t_i$ by dividing the distance by the acoustic velocity ($V_{ac}$) of the AO cell.

$$t_i = b_i / V_{ac}$$

The range over which the values of i are useful can be determined by knowing the first and last value of C. That is, by knowing the deflection angles at the start and finish of the sweep:

$$C_{start} = a \cos(\theta_{start}) \text{ and } i_{start} = \frac{2 C_{start}}{\lambda}$$

-continued $$C_{stop} = a \cos(\theta_{stop}) \text{ and } i_{stop} = \frac{2 C_{stop}}{\lambda}$$

"$C_i$" in FIG. 8 indicates the start and stop distances generally.

The values of $\theta$ at the start and finish of the chirp (indicated generally by $\theta_i$ in FIG. 8) are determined in the traditional manner. That is, they fall within the normal operating range of the AO cell and are chosen specifically to meet the user's application.

While the invention has been described in some detail herein, it is to be understood that this detailed description is by way of example only, and the protection granted is to be limited only within the spirit of the invention and the scope of the following claims.

We claim:

1. An AO controlled laser scanning system comprising laser means, AO laser beam scanner means, means to feed the laser beam from said laser means into said scanner means, clock means producing a first stream of clock pulses at a constant period, circuit means for producing an output stream of pulses of predetermined configuration and predetermined period based on said clock pulses, means to feed said output stream of pulses to said scanner means, said pulse producing circuit means comprising means which control the start time and ending time of each pulse in said output stream of pulses individually, said pulse producing circuit means comprising pulse forming means and control means for said pulse forming means, and means to provide pulse forming signals from said pulse forming control means to said pulse forming means with relation to said clock pulses and with relation to said predetermined configuration and predetermined period to produce said output stream of pulses.

2. The combination of claim 1, wherein said pulse forming control means comprises memory means, and means to store information in said memory means corresponding to said predetermined configuration and said predetermined period of said individual output stream of pulses.

3. The combination of claim 1, said pulse forming control means comprising calculating means.

4. The combination of claim 1, said AO laser scanning system also comprising input and output laser beam control optics located on the input and output sides respectively of said AO laser beam scanner means with respect to said laser beam.

5. The combination of claim 1, wherein said output stream of pulses are of square wave configuration.

6. The combination of claim 5, wherein said output stream of pulses are of a chirp frequency.

7. The combination of claim 5, wherein said output stream of pulses are of constant frequency.

8. The combination of claim 1, wherein said predetermined period of said output stream of pulses is at least in portions of said stream of shorter time duration than the period of said clock pulses.

9. The combination of claim 1, said pulse forming means comprising tapped delay line means.

* * * * *